(12) United States Patent
Xie et al.

(10) Patent No.: US 10,133,424 B2
(45) Date of Patent: Nov. 20, 2018

(54) CAPACITIVE TOUCH SCREEN AND MANUFACTURING METHOD THEREOF

(71) Applicants: BOE Technology Group Co., Ltd., Beijing (CN); Hefei Xinsheng Optoelectronics Technology Co., Ltd., Anhui (CN)

(72) Inventors: Taofeng Xie, Beijing (CN); Lei Zhang, Beijing (CN); Lingyan Wu, Beijing (CN); Yang Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 323 days.

(21) Appl. No.: 14/785,459

(22) PCT Filed: Feb. 27, 2015

(86) PCT No.: PCT/CN2015/073338
§ 371 (c)(1),
(2) Date: Oct. 19, 2015

(87) PCT Pub. No.: WO2016/065781
PCT Pub. Date: May 6, 2016

(65) Prior Publication Data
US 2016/0342239 A1    Nov. 24, 2016

(30) Foreign Application Priority Data
Oct. 29, 2014   (CN) .......................... 2014 1 0598383

(51) Int. Cl.
*G06F 3/041*   (2006.01)
*G06F 3/044*   (2006.01)
*H05K 3/10*    (2006.01)

(52) U.S. Cl.
CPC ............... *G06F 3/044* (2013.01); *H05K 3/10* (2013.01); *H05K 3/108* (2013.01); *G06F 2203/04103* (2013.01); *H05K 2201/10128* (2013.01)

(58) Field of Classification Search
CPC .......... G06F 3/041; G06F 3/044; G06F 3/045; G06F 3/0416
(Continued)

(56) References Cited

U.S. PATENT DOCUMENTS

2009/0225045 A1* 9/2009 Liu ........................ G06F 3/0412
345/173
2012/0256851 A1* 10/2012 Wang ..................... G06F 3/041
345/173
(Continued)

FOREIGN PATENT DOCUMENTS

| CN | 102591156 A | 7/2012 |
|---|---|---|
| CN | 102662537 A | 9/2012 |

(Continued)

OTHER PUBLICATIONS

Rejection Decision from Chinese Patent Application No. 201410598383.7, dated Aug. 16, 2017, 11 pages.
(Continued)

*Primary Examiner* — Calvin C Ma
(74) *Attorney, Agent, or Firm* — Westman, Champlin & Koehler, P.A.

(57) ABSTRACT

The present disclosure discloses a capacitive touch screen and a manufacturing method thereof. The capacitive touch screen comprises a substrate, a photoresist layer formed on the substrate, a reflective layer formed on the photoresist layer and a lead for a metal touch layer formed above the reflective layer and shielded by the photoresist layer in use, wherein a projection of the reflective layer on the substrate
(Continued)

covers a projection of the lead for the metal touch layer on the substrate. With the present disclosure, the problem that the white photoresist in the existing capacitive touch screen has a high transmittance and cannot shield the lead for the metal touch layer, can be solved.

18 Claims, 2 Drawing Sheets

(58) Field of Classification Search
USPC .................................................. 345/173, 174
See application file for complete search history.

(56) References Cited

U.S. PATENT DOCUMENTS

| | | | | |
|---|---|---|---|---|
| 2013/0106746 A1* | 5/2013 | Lai | ........................ | G06F 3/041 345/173 |
| 2013/0293508 A1 | 11/2013 | Lin et al. | | |
| 2014/0368757 A1* | 12/2014 | Chen | ................ | H03K 17/9622 349/12 |
| 2015/0309653 A1* | 10/2015 | Ho | ........................ | G06F 3/041 345/174 |
| 2015/0370388 A1* | 12/2015 | Choi | ...................... | G06F 3/047 345/173 |

FOREIGN PATENT DOCUMENTS

| | | |
|---|---|---|
| CN | 102799313 A | 11/2012 |
| CN | 103383616 A | 11/2013 |
| CN | 104331201 A | 2/2015 |

OTHER PUBLICATIONS

First Office Action, including Search Report, for Chinese Patent Application No. 201410598383.7, dated Oct. 19, 2016, 12 pages.
Second Office Action for Chinese Patent Application No. 201410598383.7, dated May 5, 2017, 11 pages.
International Search Report and Written Opinion for PCT Application No. PCT/CN2015/073338, dated Aug. 6, 2015, 11 pages.
English translation of Box No. V from the Written Opinion for the International Searching Authority for PCT Application No. PCT/CN2015/073338, 2 pages.

* cited by examiner

CAPACITIVE TOUCH SCREEN AND MANUFACTURING METHOD THEREOF

CROSS-REFERENCE TO RELATED APPLICATION

This application is a Section 371 National Stage Application of International Application No. PCT/CN2015/073338, filed on Feb. 27, 2015, entitled "CAPACITIVE TOUCH SCREEN AND MANUFACTURING METHOD THEREOF", which has not yet published, which claims priority to Chinese Application No. 201410598383.7, filed on Oct. 29, 2014, incorporated herein by reference in their entirety.

BACKGROUND OF THE INVENTION

Field of the Invention

The present disclosure relates to a technical field of touch screen, in particular, to a capacitive touch screen and a manufacturing method thereof.

Description of the Related Art

In present, a technique of OGS (One Glass Solution) capacitive touch screen has advantages, such as a simple structure, less thickness, lighter weight, good transmittance and the like, compared to the existing popular G/G (glass/glass) capacitive touch screen. Since one glass substrate and one attaching process are omitted, the OGS capacitive touch screen also has advantages of reducing manufacture cost, increasing high product yield and the like. Therefore, the OGS capacitive touch screen has a great market prospect.

The OGS capacitive touch screen comprises a display region located at a center of the screen and a non-display region located at an edge of the screen and surrounding the display region. In a manufacturing process of the OGS capacitive touch screen, a black photoresist is formed in the non-display region located on a substrate provided in the outermost layer of the screen, so as to shield a lead for a metal touch layer formed under the black photoresist and located in an inner layer of the screen. In consideration of product artistic appearance, a type of OGS capacitive touch screen, in which the black photoresist is replaced with a white photoresist, is present in the market.

However, since the white photoresist has a high transmittance, even if the photoresist layer is formed to have a great thickness, the transmittance cannot meet requirements. As a result, a user can see the lead for a metal touch layer through the white photoresist, and the lead for a metal touch layer cannot be shielded.

SUMMARY OF THE INVENTION

Embodiments of the present disclosure provide a capacitive touch screen and a manufacturing method thereof to solve the problem that a white photoresist has a high transmittance and hence a lead for a metal touch layer cannot be shielded in the existing capacitive touch screen.

In order to achieve the above object, the embodiments of the present disclosure employ the following technical solutions.

According to an aspect of the present disclosure, there is provided a capacitive touch screen, comprising a substrate, a photoresist layer formed on the substrate, a reflective layer formed on the photoresist layer and a lead for a metal touch layer formed above the reflective layer and shielded by the photoresist layer in use, wherein a projection of the reflective layer on the substrate covers a projection of the lead for the metal touch layer on the substrate.

According to another aspect of the present disclosure, there is provided a touch display device, comprising the capacitive touch screen as described above.

According to a further aspect of the present disclosure, there is provided a method of manufacturing a capacitive touch screen, comprising the following steps of:

forming a layer of photoresist material on a substrate, and forming a photoresist layer by a single patterning process;

forming a layer of reflective material on the substrate formed with the photoresist layer, and forming a reflective layer by a single patterning process, so that the reflective layer is formed on the photoresist layer;

forming a lead for a metal touch layer on the substrate formed with the reflective layer;

wherein a projection of the reflective layer on the substrate covers a projection of the lead for the metal touch layer on the substrate.

In the capacitive touch screen and the manufacturing method thereof according to the embodiments of the present disclosure, by providing the reflective layer between the photoresist layer and the lead for the metal touch layer, and arranging the projection of the reflective layer on the substrate to cover the projection of the lead for the metal touch layer on the substrate, when a light ray, which has passed through the lead, arrives at the reflective layer, it is reflected by the reflective layer and will not exit out of the screen via the white photoresist layer. In this way, a user will not see the lead for the metal touch layer through the photoresist layer and the reflective layer, so that the lead for the metal touch layer can be shielded.

BRIEF DESCRIPTION OF THE DRAWINGS

In order to explain technical solutions according to the embodiments of the present disclosure or the prior art in detail, the drawings required for describing the embodiment of the present disclosure and the prior art will be illustrated as follow. Obviously, the drawings to be described only relate to some embodiments of the present disclosure. One skilled in the art can obtain other drawings according to these figures without paying any inventive efforts.

DETAILED DESCRIPTION OF PREFERRED EMBODIMENTS OF THE INVENTION

Technical solutions according to embodiments of the present disclosure will be clearly described hereinafter in detail with reference to the attached drawings. Obviously, the described embodiments are only a part of the embodiments of the present disclosure, not all of the embodiments of the present disclosure. Based on the embodiments of the present disclosure, all other embodiments obtained by one skilled in the art without paying any inventive effort shall fall within the scope of the present invention.

Figure 2A:
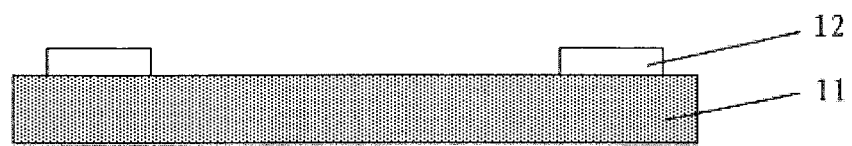
FIGS. 2A-2D are schematic views, in cross-section, of the structures formed by respective steps of the method of manufacturing the capacitive touch screen according to another embodiment of the present disclosure.
Figure 2B:
Figure 2C:
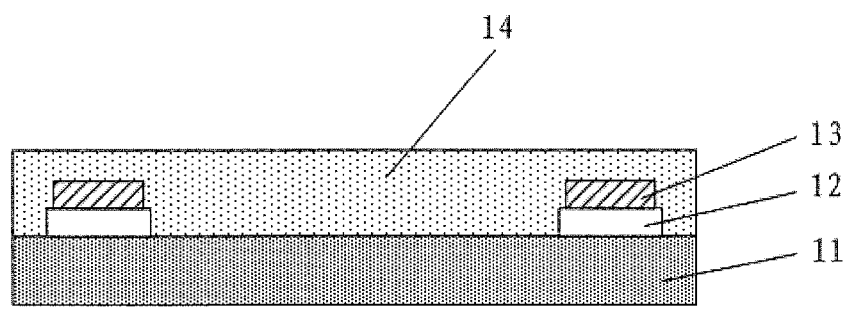
Figure 2D:
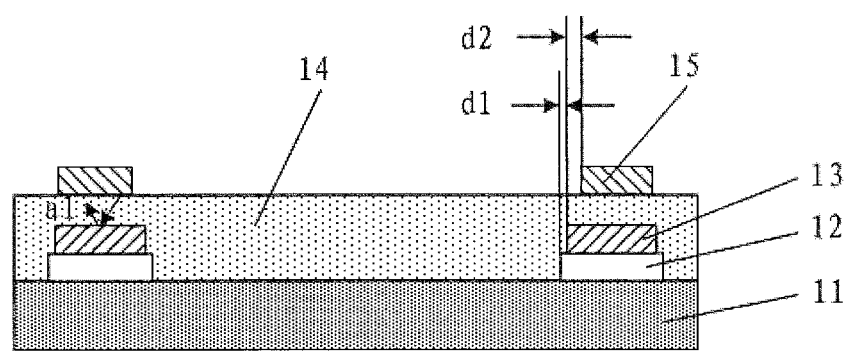

As shown in FIG. 2D, a capacitive touch screen according to an embodiment of the present disclosure comprises a substrate 11, a photoresist layer 12 (e.g., a white photoresist layer) formed on the substrate 11, a reflective layer 13 formed on the photoresist layer 12 and a lead 15 for a metal touch layer. The lead 15 for a metal touch layer is formed above the reflective layer 13 and is shielded by the photoresist layer in use. A projection of the reflective layer 13 on the substrate 11 covers a projection of the lead 15 for the metal touch layer on the substrate 11.

In the capacitive touch screen according to the present embodiment, the reflective layer 13 is provided between the photoresist layer 12 and the lead 15 for the metal touch layer, and the projection of the reflective layer 13 on the substrate covers the projection of the lead 15 for the metal touch layer on the substrate. When a light ray a1, which has passed through the lead 15, arrives at the reflective layer 13, it is reflected by the reflective layer 13 and will not exit out of the screen via the white photoresist layer 12. In this way, a user will not see the lead 15 for the metal touch layer through the photoresist layer 12 and the reflective layer 13, so that the lead for the metal touch layer can be shielded. Especially, such configuration is suitable for being used in structures of OGS capacitive touch screens.

In the above capacitive touch screen, a distance d2 between a projection of an inner edge of the reflective layer 13 on the substrate 11 and a projection of an inner edge of the lead 15 for the metal touch layer on the substrate 11 is preferably not less than 0.5 mm, so that a projection region of the reflective layer 13 on the substrate 11 not only covers a projection region of the lead 15 on the substrate completely, but also is beyond the projection region of the lead 15. Therefore, this distance range is arranged to further ensure that the user cannot see the lead 15. It should be noted that a maximum value of the distance is not limited in the present disclosure, as long as the magnitude of the distance can meet the requirement that the user cannot see the lead.

In the above capacitive touch screen, the projection of the photoresist layer 12 on the substrate 11 preferably covers the projection of the reflective layer 13 on the substrate 11. The projection region of the reflective layer 13 on the substrate 11 and the projection region of the photoresist layer 12 on the substrate 11 may substantially overlap each other. Of course, the projection region of the reflective layer 13 on the substrate 11 may be less than the projection region of the photoresist layer 12 on the substrate 11. Ideally, the projection region of the reflective layer 13 is slightly less than the projection region of the photoresist layer 12. A distance d1 between the projection of the inner edge of the photoresist layer 12 on the substrate 11 and the projection of the inner edge of the reflective layer 13 on the substrate 11 may be between 10 and 20 µm. In this way, when the reflective layer 13 is formed by etching, it is unnecessary to strictly control the edge of the reflective layer 13 and the edge of the photoresist layer 12 to be aligned with each other, so that complexity of operation of the etching process can be reduced.

If a range covered by the projection of the reflective layer 13 is beyond that covered by the projection of the photoresist layer 12, in the range covered by the projection of the photoresist layer 12, when the light ray, which has been transmitted through the reflective layer 13, passes through the photoresist layer 12, only a part of the light ray can exit out of the screen due to shielding caused by the photoresist layer 12; in the region corresponding to the covered range of the reflective layer 13 beyond the covered range by the photoresist layer 12, since there is no shielding from the photoresist layer 12, the light ray, which has been transmitted through the reflective layer 13, exits out of the screen entirely, so that this region has a relatively higher brightness to form a bright edge, thereby adversely influencing an appearance. Therefore, it is necessary to cover the projection of the reflective layer 13 on the substrate 11 by the projection of the photoresist layer 12 on the substrate 11.

In the above capacitive touch screen, the reflective layer 13 may be made of a conductive material or may be made of a non-conductive material. In an embodiment, the non-conductive material may be a mirror ink. Since the mirror ink is composed of basic material, such as special aluminum flake pigment, a small amount of resin and the like, and the aluminum flake pigment is in flake shape and can achieve a property of mirror reflection by being arranged on a surface in parallel arrangement, the mirror ink can function to reflect the light ray. Such material is formed on the substrate by printing.

As described above, the capacitive touch screen further comprises the lead 15 for a metal touch layer located above the reflective layer 13 and shielded by the photoresist layer in use, and the metal touch layer is a metal wire layer that can achieve a touch function, including a touch function portion (not shown) located in a display region and the lead 15 located in a non-display region. The lead 15 is formed above the reflective layer 13, e.g., is directly provided on the reflective layer 13 or is indirectly provided over the reflective layer 13 with an insulation layer being arranged therebetween, so that the reflective layer 13 can shield the lead 15 provided inside the screen and thus the user cannot see the lead 15 provided inside the screen through the photoresist layer 12.

In an embodiment, in a case where the reflective layer 13 is made of the non-conductive material, the metal touch layer can be directly formed on the substrate formed with the reflective layer 13, i.e., directly formed on the reflective layer 13, such that the lead 15 directly contacts the reflective layer 13. Since the reflective layer is not conductive, it will not cause any adverse influence on the lead. In a case where the reflective layer 13 is made of the conductive material, in order to avoid the direct contact to be formed between the lead 15 and the reflective layer 13 influencing the performance of the lead 15, extra measures should be used to electrically insulate the lead 15 from the reflective layer 13, e.g., forming an insulation layer on the substrate formed with the reflective layer 13 first and then forming the lead 15 (explained as follows) thereon. In an embodiment, the conductive material may be aluminum, molybdenum, MoNb alloy, AlNd alloy or the like. Of course, it should be noted that since extra measures will cause increased manufacturing cost of the capacitive touch screen, the reflective layer 13 is preferably made of the non-conductive material.

In an embodiment, the capacitive touch screen may further comprise an insulation layer 14, as shown in FIG. 2D, which is formed on a surface of the substrate 11 on which the photoresist layer 12 and the reflective layer 13 are formed and covers the photoresist layer 12 and the reflective layer 13. That is, the insulation layer 14 is provided between the reflective layer 13 and the lead 15 for the metal touch layer. The insulation layer 14 is typically made of an insulation material. In addition to insulation function, the insulation layer 14 also can protect the reflective layer 13 and the photoresist layer 12 and flattens the surface of the substrate on which the reflective layer 13 and the photoresist layer 12 are formed. Thus, when the subsequently-formed metal touch layer is photo-etched to form the lead, the problems, such as climbing difficulty, lithographic alignment difficulty or the like, can be avoided.

In a case where the capacitive touch screen is formed with the insulation layer 14, the reflective layer 13 provided under the insulation layer 14 may be made of the conductive material, or may be made of the non-conductive material. In a case where the conductive material is used, the provision of the insulation layer not only can flatten the substrate so as to avoid the problems, such as climbing difficulty, lithographic alignment difficulty or the like, when subsequently forming the lead, but also can avoid the direct contact between the reflective layer and the lead influencing the electrical performance of the lead.

It should be noted that in a case where the reflective layer is made of the conductive material, since only the insulation layer 14 is provided between the lead 15 and the reflective layer 13, a larger parasitic capacitance is formed between the lead 15 and the metal reflective layer 13, and touch performance of the portion of the touch screen close to the non-display region may be adversely influenced. For this, integrated circuit compensation may be used to compensate or shield abnormal points at the edge region by software.

An embodiment of the present disclosure also provides a touch display device comprising the capacitive touch screen as described above.

Figure 1A:
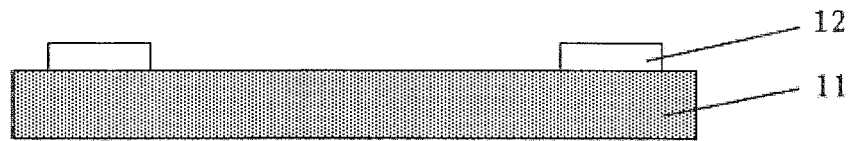
FIGS. 1A-1C are schematic views, in cross-section, of the structures formed by respective steps of the method of manufacturing the capacitive touch screen according to an embodiment of the present disclosure.
Figure 1B:
Figure 1C:
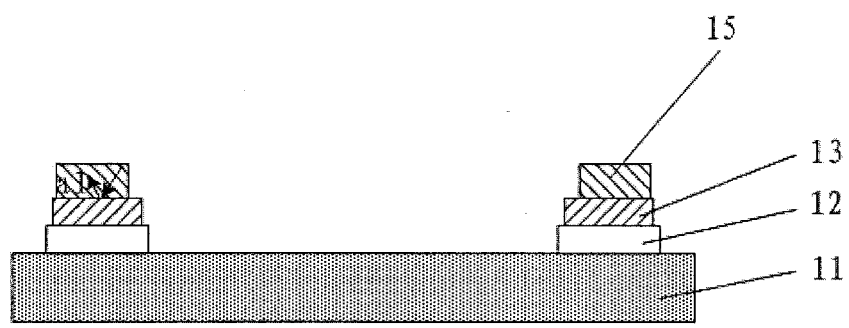

Next, the method of manufacturing the capacitive touch screen according to an embodiment of the present disclosure will be described in detail with reference to FIGS. 1A-2D, in which FIGS. 1A-1C are schematic views, in cross-section, of the structures formed by respective steps of the method of manufacturing the capacitive touch screen according to an embodiment of the present disclosure, and FIGS. 2A-2D are schematic views, in cross-section, of the structures formed by respective steps of the method of manufacturing the capacitive touch screen according to another embodiment of the present disclosure. It should be noted that same reference numbers are used for same structures in the drawings.

As shown in FIGS. 1A-1C, the method of manufacturing the capacitive touch screen according to an embodiment of the present disclosure comprises the following steps of:

S21 forming a layer of photoresist material (e.g., a layer of white photoresist material) on the substrate 11, as shown in FIG. 1A, and forming the photoresist layer 12 (e.g., the white photoresist layer 12) by a single patterning process;

S22 forming a layer of reflective material on the substrate 11 formed with the photoresist layer 12, as shown in FIG. 1B, and forming the reflective layer 13 by a single patterning process, so that the reflective layer 13 is formed on the photoresist layer 12;

S23 as shown in FIG. 1C, forming the lead 15 for the metal touch layer on the substrate 11 formed with the reflective layer 13;

wherein a projection of the reflective layer 13 on the substrate 11 covers a projection of the lead 15 for the metal touch layer on the substrate 11.

It should be noted that the patterning processes mentioned in all embodiments of the present disclosure may include coating a photoresist on the substrate, covering the substrate coated with the photoresist with a mask, and exposing, developing, etching and finally peeling off the photoresist.

In the capacitive touch screen according to the present embodiment, the reflective layer 13 is provided between the photoresist layer 12 and the lead 15 for the metal touch layer, and the projection of the reflective layer 13 on the substrate covers the projection of the lead 15 for the metal touch layer on the substrate. When a light ray a1, which has passed through the lead 15, arrives at the reflective layer 13, it is reflected by the reflective layer 13 and will not exit out of the screen via the photoresist layer 12. In this way, a user will not see the lead 15 for the metal touch layer through the photoresist layer 12 and the reflective layer 13, so that the lead for the metal touch layer can be shielded.

In the manufacturing method according to this embodiment, the reflective layer 13 may be made of a conductive material or may be made of a non-conductive material. In an embodiment, in a case where the reflective layer 13 is made of the non-conductive material, in the above manufacturing method, the step S23 of forming the lead 15 for the metal touch layer on the substrate 11 formed with the reflective layer 13 may specifically comprise forming a conductive layer of metal touch material on a surface of the substrate 11 on which the photoresist layer 12 and the reflective layer 13 are formed, and as shown in FIG. 1C, forming the lead 15 for the metal touch layer by a single patterning process.

In a case where the reflective layer 13 is made of the conductive material, in order to avoid the direct contact between the lead 15 and the reflective layer 13 to be formed influencing the performance of the lead 15, extra measures may be used to electrically insulate the lead 15 from the reflective layer 13, e.g., forming an insulation layer on the substrate formed with the reflective layer 13 first and then forming the lead 15. Specifically, in an alternative embodiment, the step S23 of forming the lead 15 for the metal touch layer on the substrate 11 formed with the reflective layer 13 may specifically comprise:

as shown in FIG. 2C, forming the insulation layer 14 on the surface of the substrate 11 on which the photoresist layer 12 and the reflective layer 13 are formed, wherein the insulation layer 14 covers the photoresist layer 12 and the reflective layer 13;

forming the layer of metal touch material on the insulation layer 14; and as shown in FIG. 2D, forming the lead 15 for the metal touch layer by a single patterning process.

The insulation layer 14 is typically made of an insulation material. In addition to insulation function, the insulation layer 14 also can protect the reflective layer 13 and the photoresist layer 12 and flattens the surface of the substrate on which the reflective layer 13 and the photoresist layer 12 are formed. Thus, when the subsequently-formed metal touch layer is photo-etched to form the lead, the problems, such as climbing difficulty, lithographic alignment difficulty or the like, can be avoided.

The lead 15 is formed on the insulation layer 14. The lead 15 and the reflective layer 13 are electrically insulated from each other due to the insulation layer 14 provided therebetween, so as to avoid the direct contact between the lead 15 and the conductive reflective layer 13 to be formed influencing performance of the lead 15.

It should be noted that in the manufacturing method according to this embodiment, the reflective layer 13 may be made of the conductive material, or may be made of the non-conductive material. Preferably, the reflective layer 13 is made of the non-conductive material. In a case where the conductive material is used, the provision of the insulation layer not only can flatten the substrate so as to avoid the problems, such as climbing difficulty, lithographic alignment difficulty or the like, when subsequently forming the lead, but also can avoid the direct contact between the reflective layer and the lead influencing the electrical performance of the lead.

If the reflective layer is made of the conductive material, since only the insulation layer 14 is provided between the lead 15 and the reflective layer 13, a larger parasitic capacitance is formed between the lead 15 and the metal reflective layer 13, and touch performance of the portion of the touch screen close to the non-display region may be adversely influenced. For this, integrated circuit compensation may be used to compensate or shield abnormal points at the edge region by software.

The above embodiments are given only by ways of examples instead of limiting the present invention. Any changes, equivalent replacement, and modification within the spirit and principles of the disclosure can be made by those skilled in the art and should fall into the scope of the present invention. Therefore, the scope of the present invention should be defined by the attached claims.

What is claimed is:

1. A capacitive touch screen, comprising:
a substrate;
a photoresist layer formed on the substrate;
a reflective layer formed on the photoresist layer; and
a lead for a metal touch layer formed above the reflective layer and shielded by the photoresist layer in use;
wherein a projection of the reflective layer on the substrate covers a projection of the lead for the metal touch layer on the substrate, and
wherein a distance between a projection of an inner edge of the reflective layer on the substrate and a projection of an inner edge of the lead for the metal touch layer on the substrate is not less than 0.5 mm.

2. The capacitive touch screen according to claim 1, wherein a projection of the photoresist layer on the substrate covers the projection of the reflective layer on the substrate.

3. The capacitive touch screen according to claim 2, wherein a distance between a projection of an inner edge of the photoresist layer on the substrate and the projection of the inner edge of the reflective layer on the substrate is in a range of 10 to 20 µm.

4. The capacitive touch screen according to claim 1, wherein the lead for the metal touch layer is formed on the reflective layer.

5. The capacitive touch screen according to claim 4, wherein the reflective layer is made of a non-conductive material.

6. The capacitive touch screen according to claim 1, further comprising an insulation layer, wherein the insulation layer is formed on a surface of the substrate on which the photoresist layer and the reflective layer are formed and covers the photoresist layer and the reflective layer, and the lead for the metal touch layer is provided on the insulation layer.

7. The capacitive touch screen according to claim 6, wherein the reflective layer is made of a conductive metal material.

8. The capacitive touch screen according to claim 1, wherein the photoresist layer is a white photoresist layer.

9. A touch display device, comprising a capacitive touch screen, wherein the capacitive touch screen comprises:
a substrate;
a photoresist layer formed on the substrate;
a reflective layer formed on the photoresist layer; and
a lead for a metal touch layer formed above the reflective layer and shielded by the photoresist layer in use;
wherein a projection of the reflective layer on the substrate covers a projection of the lead of the metal touch layer on the substrate, and
wherein a distance between a projection of an inner edge of the reflective layer on the substrate and a projection of an inner edge of the lead for the metal touch layer on the substrate is not less than 0.5 mm.

10. A method of manufacturing a capacitive touch screen, comprising the following steps of:
forming a layer of photoresist material on a substrate, and forming a photoresist layer by a single patterning process;
forming a layer of reflective material on the substrate formed with the photoresist layer, and forming a reflective layer by a single patterning process, so that the reflective layer is formed on the photoresist layer;
forming a lead for a metal touch layer on the substrate formed with the reflective layer;
wherein a projection of the reflective layer on the substrate covers a projection of the lead for the metal touch layer on the substrate, and
wherein a distance between a projection of an inner edge of the reflective layer on the substrate and a projection of an inner edge of the lead for the metal touch layer on the substrate is not less than 0.5 mm.

11. The method according to claim 10, wherein the step of forming the lead for a metal touch layer on the substrate formed with the reflective layer comprises:
forming a layer of metal touch material on a surface of the substrate on which the photoresist layer and the reflective layer are formed; and
forming the lead for the metal touch layer by a single patterning process.

12. The method according to claim 10, wherein the step of forming the lead for a metal touch layer on the substrate formed with the reflective layer comprises:
forming an insulation layer on a surface of the substrate on which the photoresist layer and the reflective layer are formed, wherein the insulation layer covers the photoresist layer and the reflective layer;
forming the layer of metal touch material on the insulation layer; and
forming the lead for the metal touch layer by a single patterning process.

13. The method according to claim 10, wherein the photoresist layer is a white photoresist layer.

14. The touch display device according to claim 9, wherein a projection of the photoresist layer on the substrate covers the projection of the reflective layer on the substrate.

15. The touch display device according to claim 14, wherein a distance between a projection of an inner edge of the photoresist layer on the substrate and the projection of the inner edge of the reflective layer on the substrate is in a range of 10 to 20 µm.

16. The touch display device according to claim 9, wherein the lead for the metal touch layer is formed on the reflective layer, and the reflective layer is made of a non-conductive material.

17. The touch display device according to claim 9, further comprising an insulation layer, wherein the insulation layer is formed on a surface of the substrate on which the photoresist layer and the reflective layer are formed and covers the photoresist layer and the reflective layer, and the lead for the metal touch layer is provided on the insulation layer.

18. The touch display device according to claim 17, wherein the reflective layer is made of a conductive metal material.

* * * * *